US012811570B2

(12) United States Patent
Rahajandraibe et al.

(10) Patent No.: US 12,811,570 B2
(45) Date of Patent: Nov. 24, 2026

(54) METHOD FOR GENERATING A NEGATIVE GROUP DELAY AND ASSOCIATED ELECTRONIC DEVICE AND COMPUTER PROGRAM PRODUCT

(71) Applicants: UNIVERSITÉ D'AIX-MARSEILLE, Marseilles (FR); CENTRE NATIONAL DE LA RECHERCHE SCIENTIFIQUE, Paris Cedex (FR)

(72) Inventors: Wenceslas Rahajandraibe, Marseilles (FR); Mathieu Guerin, Marseilles (FR)

(73) Assignees: Université d'Aix-Marseille, Marseilles (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 185 days.

(21) Appl. No.: 18/720,782

(22) PCT Filed: Dec. 13, 2022

(86) PCT No.: PCT/EP2022/085654
§ 371 (c)(1),
(2) Date: Jun. 17, 2024

(87) PCT Pub. No.: WO2023/110891
PCT Pub. Date: Jun. 22, 2023

(65) Prior Publication Data
US 2025/0070760 A1 Feb. 27, 2025

(30) Foreign Application Priority Data
Dec. 17, 2021 (FR) ........................................ 2113789

(51) Int. Cl.
*H03H 17/00* (2006.01)

(52) U.S. Cl.
CPC ................................ *H03H 17/0009* (2013.01)

(58) Field of Classification Search
CPC .................................................. H03H 17/0009
See application file for complete search history.

(56) References Cited

U.S. PATENT DOCUMENTS

| | | | | |
|---|---|---|---|---|
| 10,034,089 | B2 * | 7/2018 | Straeussnigg | H03G 5/005 |
| 2020/0389726 | A1 | 12/2020 | Melanson | |
| 2024/0322833 | A1 * | 9/2024 | Straeussnigg | H04R 3/00 |

OTHER PUBLICATIONS

International Search Report dated Apr. 12, 2023 for corresponding International Application No. PCT/EP2022/085654, filed Dec. 13, 2022.

(Continued)

*Primary Examiner* — Andrea Lindgren Baltzell
*Assistant Examiner* — Kimberly E Glenn
(74) *Attorney, Agent, or Firm* — Sughrue Mion, PLLC

(57) ABSTRACT

A method for generating, by an electrical device based on an input signal, an output signal that exhibits a negative group delay. The method includes the following steps, carried out by a programmable digital processing unit of the device: obtaining a sampling frequency associated with a digital signal representative of the input signal; obtaining a target negative group delay value; determining a set of coefficients for a differential equation according to the sampling frequency and the target negative group delay value; calculating, upon acquiring a current value of the digital signal, a corresponding current value of the output signal by using the differential equation.

10 Claims, 4 Drawing Sheets

(56) References Cited

OTHER PUBLICATIONS

Written Opinion of the International Searching Authority dated Apr. 12, 2023 for corresponding International Application No. PCT/EP2022/085654, filed Dec. 13, 2022.
French Search Report and Written Opinion dated Aug. 5, 2022 for corresponding French Application No. 2113789, filed Dec. 17, 2021.
Ravelo Blaise et al., "Low-Pass NGD Numerical Function and STM32 MCU Emulation Test," Sep. 10, 2021 (Sep. 10, 2021), vol. {0} 69, No. {0} 8, p. 8346-8355, XP011901824.
Ravelo Blaise, "Elementary NGD IIR/FIR Systems," vol {0} 2, No. {0} 2, DOI: 10.12720/ijsps.2.2. 132-138 external link ISSN:2315-4535, Dec. 1, 2014 (Dec. 1, 2014), p. 132-138, International Journal of Signal Processing Systems Retrieved from the Internet: URL:http://www.ijsps.com/uploadfile/2014/0806/20140806032305563.pdf, XP055948781.
Henning U Voss, "A universal negative group delay filter for the prediction of band-limited signals", arxiv.org, Cornell University Library, 201 Olin Library Cornell University Ithaca, NY 14853, Jun. 22, 2017 (Jun. 22, 2017), XP081281831.

* cited by examiner

METHOD FOR GENERATING A NEGATIVE GROUP DELAY AND ASSOCIATED ELECTRONIC DEVICE AND COMPUTER PROGRAM PRODUCT

CROSS-REFERENCE TO RELATED APPLICATIONS

This Application is a Section 371 National Stage Application of International Application No. PCT/EP2022/085654, filed Dec. 13, 2022, and published as WO 2023/110891 A1 on Jun. 22, 2023, not in English, which claims priority to French Patent Application No. 2113789, filed Dec. 17, 2021, the contents of which are hereby incorporated by reference in their entireties.

TECHNICAL FIELD

The field of the invention is that of electronics, and more particularly electronic devices for generating a negative group delay.

PRIOR ART

In general terms, an electronic circuit is made up of elements of different natures (e.g. transistors, resistors, self-inductance components, capacitors, etc.) connected to one another in different configurations (also referred to as topologies), in order to generate one or more precise functions (e.g. amplifying, filtering, etc.). From these functions, it has been shown that certain analogue electronic circuits have the singular property of generating a negative group delay.

Such a property is illustrated schematically by FIG. 1, which shows a comparison of the results of the interaction of a Gaussian (i.e. bell-shaped) signal with a conventional device $D_c$ on the one hand, and the interaction of this same signal with a device with a negative group delay $D_{NGD}$ on the other hand. In this figure, the conventional device $D_c$ and the device with negative group delay $D_{NGD}$ are represented in the form of a black box, and it is assumed, in a deliberately simplified model for explanatory reasons, that the signal does not undergo any shape deformation when passing through either of the devices.

First of all a conventional device $D_c$ will be discussed. A first portion of the signal, corresponding to a rising edge, enters the conventional device $D_c$ at time $t_0$. As shown in FIG. 1, the signal takes a certain amount of time to emerge from the device, and the group propagation time (GPT) of the device corresponds to the time interval between the moment when the maximum amplitude of the signal enters the device and the moment when it emerges from it. Physically, the group propagation time is associated with the propagation speed of the energy contained in this signal, and it generally corresponds to a delay induced by the device on the signal.

Looking now at the negative group delay $D_{NGD}$, device, it should be noted that the moment to at which the signal starts to enter this device, it has also already largely emerged from the latter. More particularly, the maximum amplitude of the output signal leaves the $D_{NGD}$ device even before the maximum amplitude of the input signal enters it, hence the term "negative group delay time" to describe this unique property of the $D_{NGD}$ device. In other words, the negative group delay $D_{NGD}$ device is in some way capable of regenerating the input signal by anticipating the evolution of its temporal form, i.e. generating an advance rather than a delay.

While it is easy to understand that such a property has undeniable potential in many fields of activity (e.g. physics, biology, medicine, and more generally in any field where the reaction time of an electronic device is important) it should be noted that its practical applications are currently very limited, if not almost non-existent.

This is essentially due to a number of constraints and limitations associated with current solutions for generating a negative group delay.

Firstly, with current negative group delay devices, the generation of the negative group delay is confined to a very limited, or at least relatively narrow, range of frequencies. The negative group propagation time is therefore generally not obtained over the entire bandwidth of the signal to be processed, or even over a major part of this bandwidth, which significantly limits its practical applications. Furthermore, this phenomenon is also generally accompanied by a significant reduction in the amplitude of the output signal.

Secondly, the value of the negative group delay (i.e. advance) that can be achieved by a current negative group delay device is intrinsically linked not only to the particular topology of the device—i.e. the way in which its component parts are connected—but also to the particular values of these components. In other words, for a given configuration (i.e. topology and component value) of an analogue negative group delay device, only one negative group delay value is obtained, which makes it a relatively rigid solution. In addition, the current negative group delay devices, based on analogue circuits, cannot synthesise an advance beyond one second, which makes them unusable for many practical reasons (in particular industrial applications based on the use of slow signals). Current solutions for generating a negative group delay thus suffer from a significant lack of flexibility and adaptability.

Thirdly, the generation of a negative group delay imposes significant constraints in terms of the dimensions of the components required to obtain such a function, which makes these solutions difficult to reconcile with the requirements of current industrial applications. Furthermore, it has been found that for the same configuration of a negative group delay device, a small variation in certain factors is likely to have a potentially significant impact on the negative group delay value obtained. For example, small variations in the manufacturing conditions of the analogue electronic components used, or drifts linked to the rise in temperature of these components during their use, can lead to significantly different negative group delay values being obtained or even compromise the achievement of a negative group delay. This random or uncertain nature of the negative group delay obtained with the current solutions means that they are not generally considered to be sufficiently reliable or robust for industrial applications.

Thus, despite its potential, the technological obstacles and barriers described above are such that this property of generating a negative group delay offered by certain analogue electronic devices is mostly considered in the literature as a physical singularity, with no real possibility of practical applications.

There is therefore a need for a solution for generating a negative group delay that enables these numerous limitations of the prior art to be overcome at least in part.

SUMMARY OF THE INVENTION

The present technique makes it possible to propose a solution for overcoming certain disadvantages of the prior art. The present technique relates to a method for generating, by an electronic device, from a signal supplied at the input of said electronic device, a output signal having a negative group delay with respect to said input signal. According to the proposed invention, such a method comprises the following steps, implemented by a programmable digital processing unit of said electronic device:

- obtaining a sampling frequency associated with a digital signal representative of said input signal;
- obtaining a group delay value, known as the target negative group delay value;
- determining a set of coefficients of a difference equation, as a function of said sampling frequency and said target negative group delay value;
- calculating, on acquisition of a current value of said digital signal, a corresponding current value of said output signal, by means of said difference equation.

In a particular embodiment, said difference equation is determined as a function of an operating mode selected from a recursive mode and a non-recursive mode, and as a function of an order associated with said operating mode.

In a particular embodiment, said input signal is an analogue signal, and the method comprises an analogue-to digital conversion step of said input signal, said conversion step comprising sampling said input signal at said sampling frequency, providing said digital signal representative of said input signal.

According to a particular feature of this embodiment, the method comprises, prior to said analogue-to-digital conversion step, a step of conditioning said analogue input signal.

In a particular embodiment, said sampling frequency of the input analogue signal is controlled by said programmable digital processing unit.

In a particular embodiment, said sampling frequency of the input analogue signal is adapted as a function of a current rise and/or fall time of said input signal.

According to another aspect, the present technique also relates to an electronic device for generating an output signal having a negative group delay with respect to a signal supplied as input to said electronic device, said electronic device comprising a programmable digital processing unit which comprises:

- means for obtaining a sampling frequency associated with a digital signal representative of said input signal;
- means for obtaining a group delay value, referred to as the target negative group delay value;
- means for determining a set of coefficients of a difference equation, as a function of said sampling frequency and of said target negative group delay value;
- means for calculating, on acquisition of a current value of said digital signal, a corresponding current value of said output signal, by means of said difference equation.

The means of said electronic device may be adapted to implement any of the embodiments of the method of the present application.

In a particular embodiment, said electronic device comprises an analogue-to-digital converter comprising means for sampling said input signal at said sampling frequency, delivering said digital signal representative of said input signal, when said input signal is analogue.

In a particular embodiment, said programmable digital processing unit belongs to the group comprising:

- a microcontroller;
- a virtual machine running on a computer;
- an FPGA-type programmable prediffused integrated circuit;
- an ASIC-type integrated circuit with a specific application.

According to another aspect, the proposed invention also relates to a computer program product which can be downloaded from a communications network and/or stored on a computer-readable medium and/or executed by a microprocessor, comprising program code instructions for executing a method for generating a negative group delay as previously described, when executed on a computer.

The proposed technique is also aimed at a computer-readable recording medium on which a computer program is recorded comprising program code instructions for executing the steps of the method as previously described, in any of its embodiments.

Such a recording medium may be any entity or device capable of storing the program. For example, the medium may comprise a storage means, such as a ROM, for example a CD ROM or a microelectronic circuit ROM, or also a magnetic recording means, for example a USB key or a hard disk.

On the other hand, such a recording medium can be a transmissible medium, such as an electrical or optical signal, which can be conveyed via an electrical or optical cable, by radio or by other means, so that the computer program it contains can be executed remotely. In particular, the program according to the invention can be downloaded from a network, for example the internet.

The various embodiments mentioned above can be combined with one another to implement the invention.

FIGURES

Other features and advantages of the invention will become clearer on reading the following description of a preferred embodiment, given merely as an illustrative and non-limiting example, and of the accompanying drawings, in which.

Figure 6:
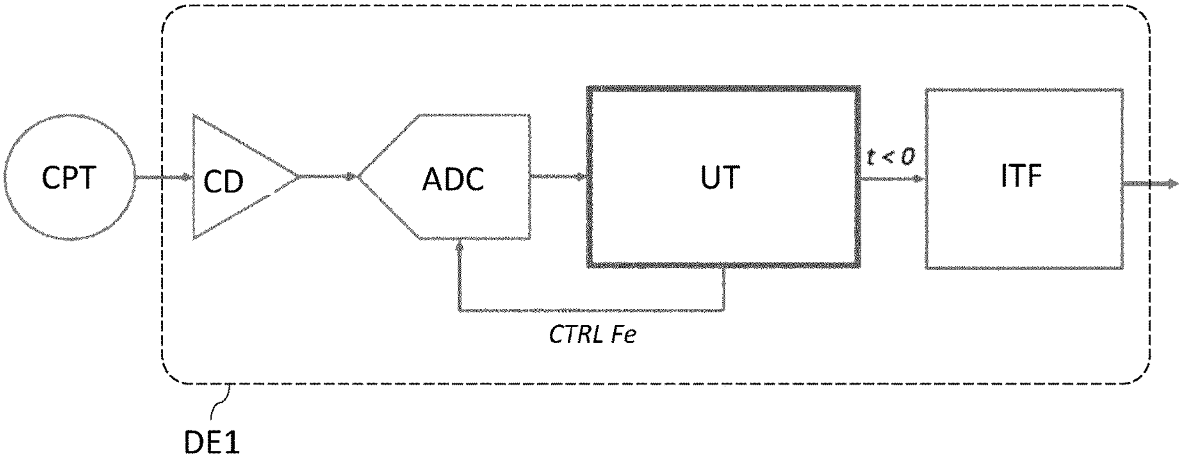
Figure 7:
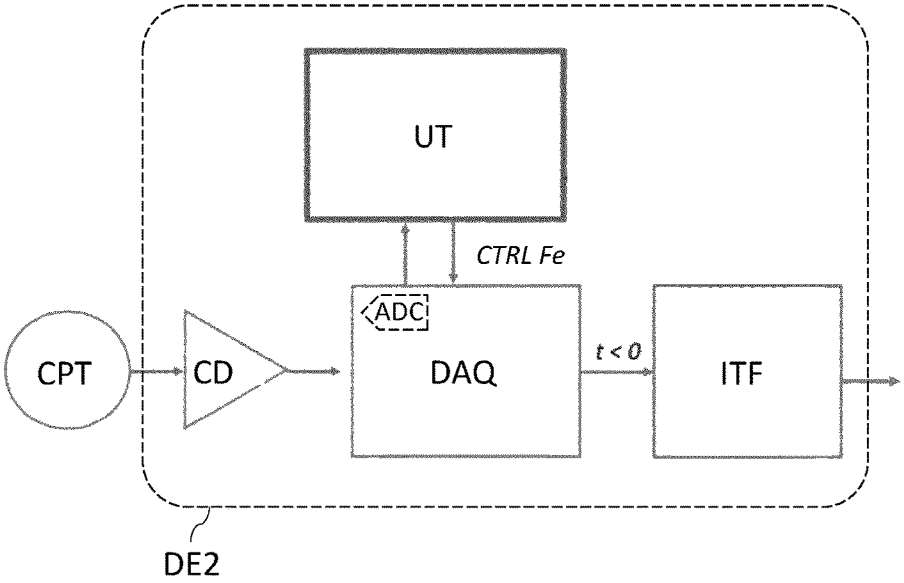
Figure 8:
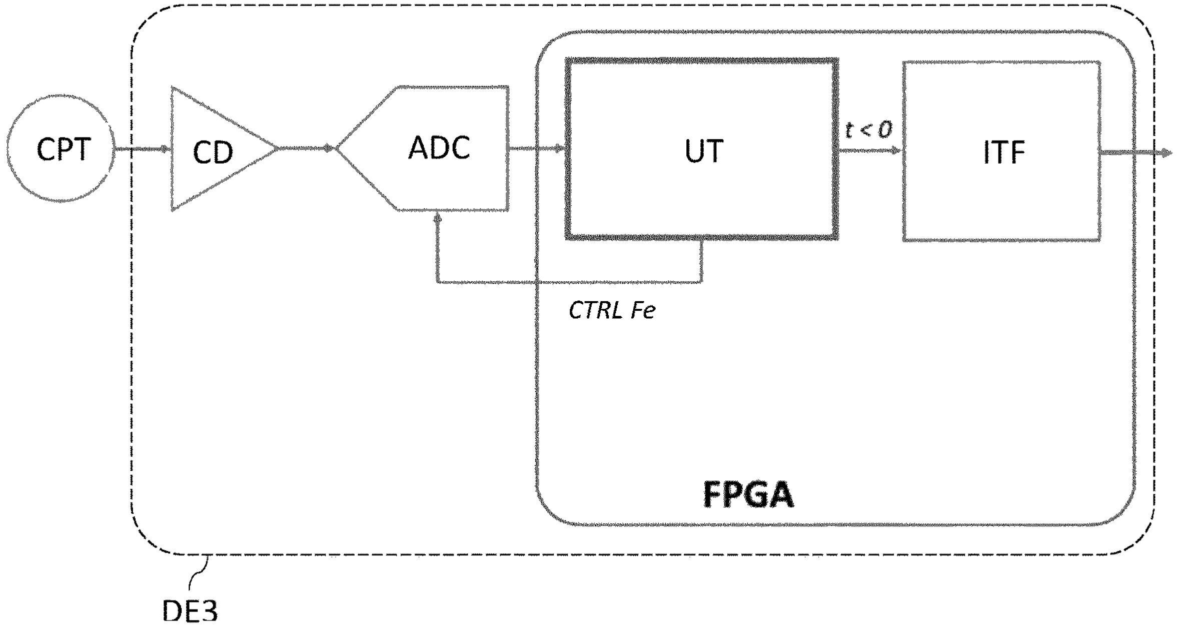
Figure 9:
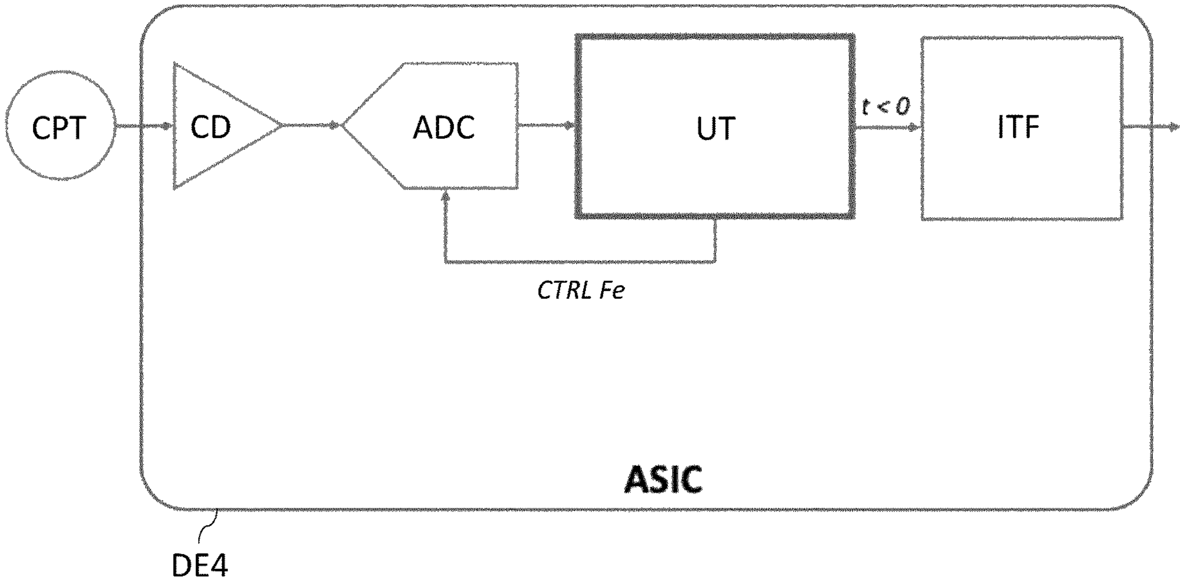

FIG. 6 describes a first implementation of an electronic device for generating a negative group delay, in a particular embodiment;

FIG. 7 describes a second implementation of an electronic device for generating a negative group delay, in a particular embodiment;

FIG. 8 describes a third implementation of an electronic device for generating a negative group propagation delay, in a particular embodiment;

FIG. 9 describes a fourth implementation of an electronic device for generating a negative group delay, in a particular embodiment.

DETAILED DESCRIPTION OF THE INVENTION

The present invention relates to a method for generating a negative group delay that makes it possible to overcome most of the obstacles and barriers cited in relation to the prior art, thus opening up the field to numerous practical applications in multiple fields (industrial, medical, general public, etc.). More specifically, the present invention aims to offer a solution for generating a negative group delay that is both robust and flexible, and can therefore be industrialised. In terms of robustness, the proposed solution is reliable, in the sense that it does not have the random or uncertain nature of existing solutions as described in relation to the prior art, with regard to the generated value of negative group delay. In terms of flexibility, the proposed solution makes it possible to generate a negative group delay that can be greater than one second (or even in the order of one minute, one hour, one day or more on certain slow signals), over a wider frequency band than the solutions of the prior art. The proposed solution is also reconfigurable, in the sense that it can dynamically and automatically modify the negative group delay (i.e. the advance) generated by the electronic device in which the method is implemented, and adaptive in the sense that it is capable of self-configuring according to the temporal nature of the input signal.

These objectives are achieved by means of a method for generating a negative group delay which is based on digital processing of the input signal. More particularly, the proposed technique relates to a method for generating an output signal having a negative group delay with respect to an input signal supplied as input to an electronic device, this method differing from solutions of the prior art in that the steps of generating the negative group delay are implemented by a programmable digital processing unit of said electronic device (the digital processing unit being programmed for this purpose, for example by means of a high-level programming language). As detailed below, in a particular embodiment of the proposed invention, the programmable digital processing unit is configured in particular to analyse the variations in the input signal (e.g. minimum and maximum values, rise and/or fall times, etc.), as the samples are acquired, and to adapt the negative group delay, in other words the advance of the output signal, automatically as a result.

Figure 1:
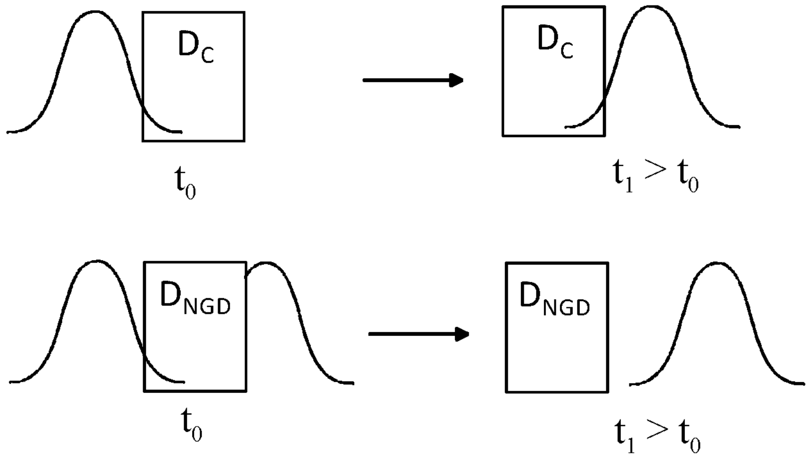
FIG. 1 illustrates, in relation to the prior art, in a simplified model, the property of generating a negative group delay.
Figure 2:
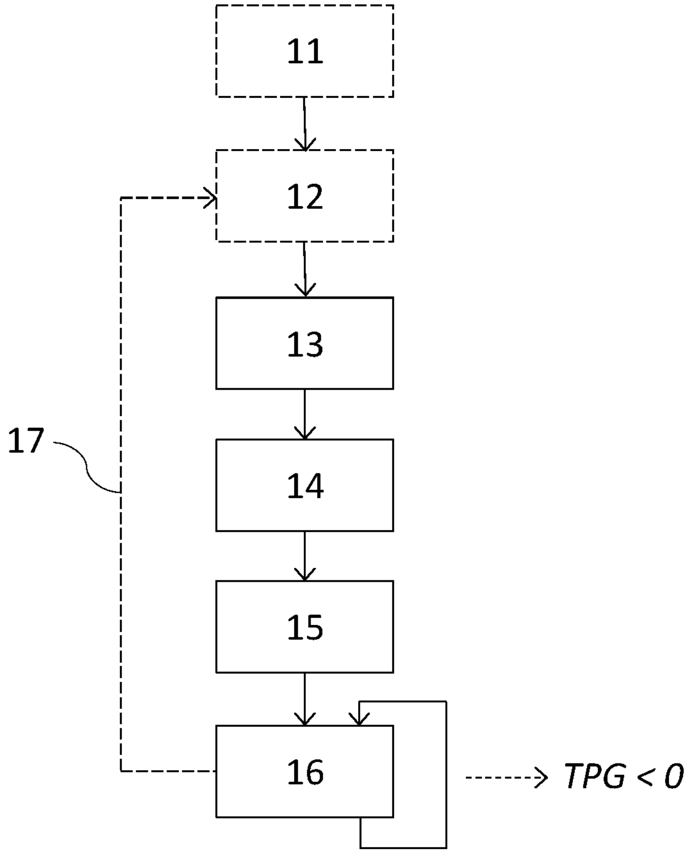
FIG. 2 shows the main steps of a method for generating a negative group delay, in a particular embodiment of the proposed technique.

FIG. 2 shows the main stages of such a method, in a particular embodiment of the proposed invention. According to one particular feature, such steps are subject to multiple iterations.

In step 13, the digital processing unit obtains a sampling frequency associated with a digital signal representative of the input signal of the electronic device. Depending on the nature of this input signal, the digital signal representing the input signal may be:

- the input signal itself, if the latter is already a digital signal, in which case the sampling frequency corresponds to a frequency of selection of the values of the input signal, which can be controlled so as to correspond, for example, to the frequency of appearance of the values of the input signal, to a lower frequency (consisting for example of selecting only one sample out of two, or out of three, or out of four etc. of the input signal values), or at a higher frequency (in which case values not initially present in the digital input signal are extrapolated as a function of previous input signal values for example);
- or the result of a step 12 of analogue-to-digital conversion of the input signal, if the latter is an analogue signal, in which case the sampling frequency corresponds to the frequency at which the analogue input signal is sampled, step 12 of analogue-to-digital conversion possibly being preceded by a step 11 of conditioning the analogue input signal comprising for example amplification and/or filtering operations enabling the signal to be prepared prior to processing.

Regardless of the nature of the input signal (digital or analogue), the sampling frequency associated with the digital signal representing the input signal can therefore be controlled by the programmable digital processing unit of the electronic device, in accordance with the procedures detailed later in relation to a particular embodiment of the proposed invention.

In step 14, the digital processing unit obtains a group delay value, referred to as the target negative group delay in that it represents the targeted time advance of the output signal relative to the input signal. Such a value is, for example, programmed manually by a user, at least initially, possibly on the basis of a preliminary study by the user of the characteristics of the input signal, and in particular its variation times. More specifically, the purpose of such a study is to take account of certain constraints that need to be complied with in order to ensure the optimum generation of the target negative group delay. In other words, the aim here is to take into account the fact that the achievable advance (i.e. the advance of the output signal that can be synthesised with sufficient robustness and stability) depends directly on the rate of variation of the input signal. Thus, according to one particular feature, the target negative group delay is less than or equal to a quarter of the instantaneous variation of the input signal (i.e. a current rise time or a current fall time of the input signal, as the case may be) when the latter is non-deterministic, or to a quarter of the period of the input signal when the latter is periodic. Controls implemented by the digital processing unit may be implemented to ensure that this constraint is respected. More particularly, in a particular embodiment, a continuous and automatic analysis of the input signal is implemented by the digital processing unit (for example each time a new value of the digital signal representative of the input signal is acquired), enabling this processing unit to estimate in real-time (or virtually real-time) a current variation time (e.g. rise or fall) of the input signal, and to adapt accordingly the target negative group delay value (in other words the achievable advance) as a function of this current variation time. According to one particular feature, the group delay value determined in step 14 is thus fixed at a quarter of the current variation time estimated in this way (or at least at a value less than a quarter of the current variation time).

In step 15, the digital processing unit determines a set of coefficients of a difference equation, as a function of the sampling frequency obtained in step 13 and the target negative group delay value obtained in step 14.

The difference equation has the following general form:

$$y[n] = \sum_{k=0}^{M} a_k x[n-k] + \sum_{k=1}^{N} b_k y[n-k]$$

In particular, the difference equation makes it possible to calculate the current value y[n] of the output signal as a function of the current value of the input signal x[n] and, depending on the case, of a certain number of previous values of the input signal and the output signal, these values being weighted by means of the coefficients determined in step 15.

According to one particular feature, the form of the difference equation (and more particularly the number of coefficients calculated in step 15) is determined as a function of an operating mode selected by the user, from a recursive mode and a non-recursive mode, and as a function of an order selected for said operating mode. The operating mode may for example correspond to a mode of order 1 infinite impulse response type (order 1 IIR), a mode of order 2 infinite impulse response type (order 2 IIR), a mode of order 1 finite impulse response type (order 1 FIR), a mode of order 2 finite impulse response type (order 2 FIR), etc.

We will now describe an example of determining the coefficients of the difference equation in the case of an order 1 infinite impulse response (order 1 IIR) mode of operation, which makes it possible to generate a "low-pass negative group delay" (LP NGD) function. In this operating mode, the difference equation has the following form:

$$y[n]=a_0x[n]+a_1x[n-1]+a_1b_1y[n-1] \quad (1)$$

Figure 3:
FIG. 3 represents a conventional synoptic of a digital function of the infinite impulse response type of order 1, in a particular embodiment of the proposed technique.

FIG. 3 shows the classic diagram of the digital function of the infinite impulse response type of order 1:

$$N(z)=\frac{Y(z)}{X(z)} \quad (2)$$

where x(n) and y(n) are the discrete inputs and outputs respectively, and n is the index of the samples (n=1, 2, . . . ).

The coefficients $a_0$, $a_1$ and $b_1$ of the difference equation (1) are determined for example from the canonical first-order analogue form of a LP NGD function, as shown below. In particular, studies have shown that the following analogue first-order transfer function (TF) is likely to behave like an unfamiliar LP NGD function:

$$N(s)=\frac{Y(s)}{X(s)} \quad (3)$$

or $$N(s)=\frac{1+a\ s}{1+b\ s} \quad (4)$$

with s being Laplace variable, and a and b are real coefficients.

Figure 4:
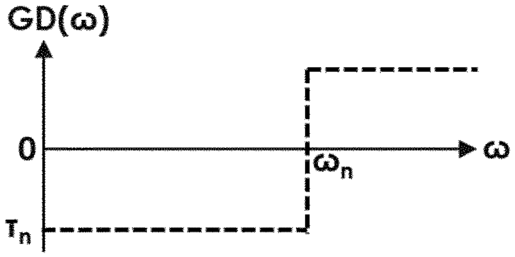
FIG. 4 illustrates an ideal group delay response, for the generation of a low-pass negative group delay function, in a particular embodiment of the proposed technique.

The features of a LP NGD function can furthermore be defined by the ideal GD (w) group propagation time response as illustrated in relation to FIG. 4. As shown in this figure, the main specification parameters are the target negative group delay value $\tau_n$ and the pulsation as a function of cut-off frequency $\omega_n=2\pi f_n$.

It has been shown in the literature that the generation of a LP NGB function from these specification parameters implies that the coefficients a and b in equation (4) have the following values:

$$a=\frac{\sqrt{\omega_n^2\tau_n^2+4}-\omega_n\tau_n}{2\omega_n} \quad (5)$$

$$b=\frac{\sqrt{\omega_n^2\tau_n^2+4}+\omega_n\tau_n}{2\omega_n} \quad (6)$$

In addition, in order to highlight the time signature of the LP NGD function, the power spectrum of the input signal X(jω) has to satisfy the condition $\omega\le\omega_{max}=\omega_n$.

Combining equations (3) and (4) leads to the following new symbolic expression as a function of the coefficients a and b:

$$Y(s)-X(s)=s[a\ X(s)-b\ Y(s)] \quad (7)$$

By adopting the hypothesis:

$$\begin{cases} x(0)=0 \\ \dfrac{dx(t=0)}{dt}=0 \\ y(0)=0 \end{cases} \quad (8)$$

the inverse Laplace transform of the previous symbolic equation is written:

$$y(t)-x(t)=a\frac{dx(t)}{dt}-b\frac{dy(t)}{dt} \quad (9)$$

This equation is the source of the formulae for calculating the coefficients $a_0$, $a_1$ and $b_1$ in equation (1). To achieve this, a discretisation is carried out, taking into account a sampling step that respects the following condition in order to minimise numerical uncertainties:

$$\Delta t=T_e\le\frac{|\tau_n|}{4} \quad (10)$$

More specifically, the continuous variable t is discretised into its sample:

$$t_n=n\ T_e \quad (11)$$

with the integer index n=0, 1, 2, . . . , nmax, where the maximum value nmax is linked to the width of the time window of the input signal tmax defined by:

$$n_{max}=Ent\left(\frac{t_{max}}{T_e}\right) \quad (12)$$

with Ent(x) the upper integer part of x.

Consequently, the discretisation is mathematically achieved by the following substitutions:

$$\begin{cases} x(t)\to x(n)=x_n \\ y(t)\to y(n)=y_n \end{cases} \quad (13)$$

This involves discretising the input and output terms into the following derivatives:

$$\frac{dx(t)}{dt}\to\frac{\Delta x[nT_e]}{\Delta t}=\frac{x[n]-x[n-1]}{T_e} \quad (14)$$

$$\frac{dy(t)}{dt}\to\frac{\Delta y[nT_e]}{\Delta t}=\frac{y[n]-y[n-1]}{T_e} \quad (15)$$

Substituting equations (13), (14) and (15) into equation (9) gives the following values calculated in step 15 for the coefficients $a_0$, @1 and $b_1$ of the difference equation (1):

$$a_0 = \frac{\omega_n(2T_e - \tau_n) + \sqrt{4 + \omega_n^2\tau_n^2}}{\sqrt{4 + \omega_n^2\tau_n^2} + \omega_n(\tau_n + 2T_e)}$$

$$a_1 = \frac{\omega_n\tau_n - \sqrt{4 + \omega_n^2\tau_n^2}}{\sqrt{4 + \omega_n^2\tau_n^2} + \omega_n(\tau_n + 2T_e)}$$

$$b_1 = \frac{\sqrt{4 + \omega_n^2\tau_n^2} + \omega_n\tau_n}{\sqrt{4 + \omega_n^2\tau_n^2} + \omega_n(\tau_n + 2T_e)}$$

where:

$\tau_n$ is a negative value corresponding to the target negative group delay time, expressed in seconds;

$T_e$ is the sampling period (inverse of the sampling frequency obtained in step 13), expressed in seconds;

and $\omega_n = 2\pi/|\tau_n|$.

Returning to a general case, in an iterative step 16, the difference equation whose coefficients were determined in step 15 is used to generate the output signal having a negative group propagation time (GPT) with respect to said input signal. More particularly, each time a current value of the digital signal representative of the input signal is obtained (or acquired)—in other words at the sampling frequency-a current value of the output signal is calculated by means of said difference equation.

In a particular embodiment, according to a principle already explained above, the last values of the input signal obtained during the last iterations of step 16 are analysed so as to estimate a current rise time or a current fall time of the input signal (i.e. a current variation time of the input signal). The results of such an estimate can then be used, in a step 17, to adapt the target negative group delay value (by automatically setting it to a quarter of the estimated current variation time for example), but also to adapt the input signal sampling frequency accordingly. The aim here is, for example, to ensure that sufficient samples are available during the subsequent implementation of the method so that the variations in the input signal can continue to be analysed with sufficient precision. According to a particular feature, the sampling frequency (i.e. the sampling frequency used for converting the analogue signal to a digital signal when the input signal to the negative group delay device is an analogue signal, or the frequency for selecting the values of the input signal when the input signal of the negative group delay device is a digital signal) is thus controlled and adjusted by the digital processing unit so that the sampling period is in the order of a tenth of the estimated current variation time. In this way, the process of generating a negative group delay is adaptive, i.e. it is capable of self-configuring according to the temporal nature of the input signal.

Figure 5:
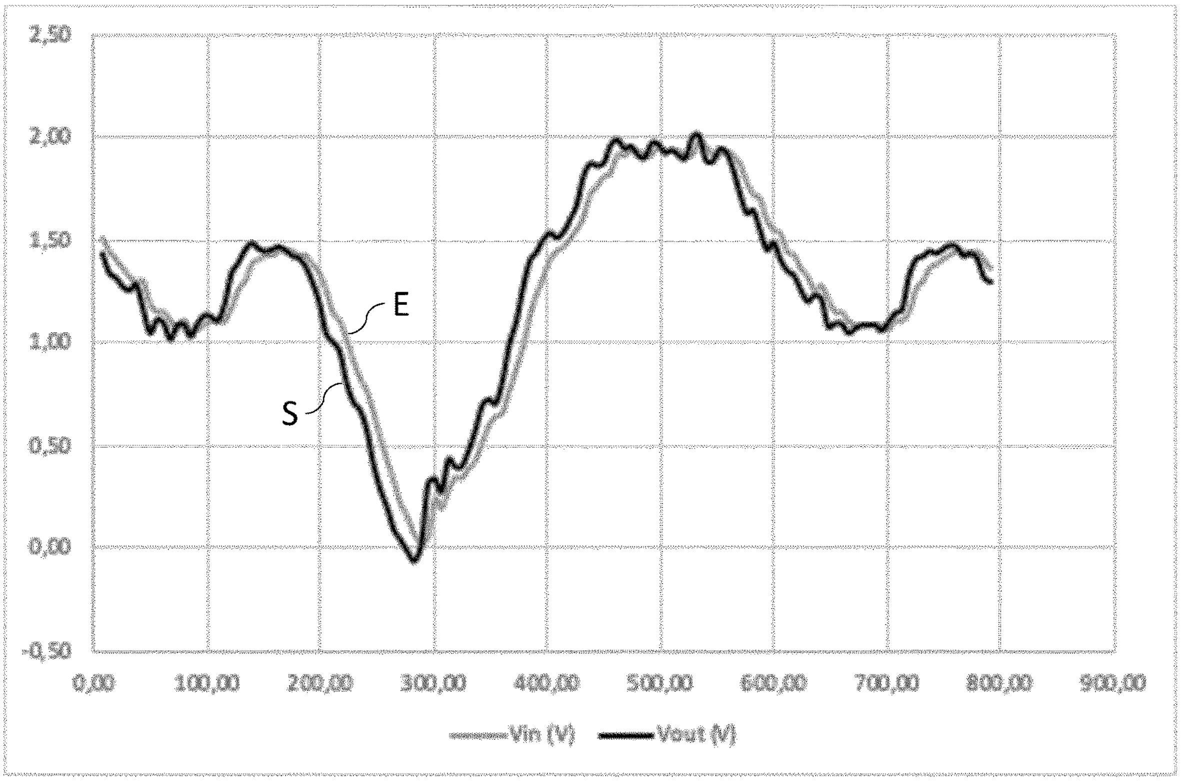
FIG. 5 shows an example of an output signal having a negative group delay with respect to an input signal, generated by means of a method according to the proposed technique, in a particular embodiment.

FIG. 5 shows an example of an output signal S generated from an analogue input signal E (in this case, the evolution of a voltage expressed in volts as a function of time expressed in seconds), by means of a method for generating a negative group delay according to the present invention. In this example, the sampling period of the input analogue signal is six seconds, and the target negative group delay value is set to ten seconds. As can be seen from this figure, the amplitude variations of the output signal S correspond well to those of the input signal E, and the output signal S has the expected advance of about ten seconds over the input signal E.

Referring now to FIGS. 6 to 9, we will now present various possible modes of implementation (DE1, DE2, DE3, DE4) of an electronic device for generating a negative group delay, according to various specific modes of implementation of the proposed technique. In all of these figures, elements of the same nature are identified by the same reference. In all the particular embodiments presented, the input signal to be processed is an analogue signal delivered by a CPT sensor, and the electronic device (DE1, DE2, DE3, DE4) for generating a negative group delay comprises a CD unit for conditioning the analogue input signal, an ADC unit for analogue-to-digital conversion of the conditioned analogue signal, a programmable digital processing unit UT for processing the digital signal delivered by the analogue-to-digital converter DAC in order to generate a digital output signal having a negative group delay with respect to this signal, and an output interface ITF making it possible for example to interface the electronic device with external devices in charge of exploiting the output signal delivered by the digital processing unit UT, possibly after a digital-to-analogue conversion of this signal.

According to the proposed technique, the programmable digital processing unit UT comprises in particular, in a particular embodiment:

- means for obtaining a sampling frequency associated with the digital signal representative of the input signal, this frequency corresponding, in the particular embodiments illustrated in FIGS. 6 to 9, to the sampling frequency of the analogue signal delivered by the CPT sensor, after conditioning;
- means for obtaining a group delay value, referred to as the target negative group delay value;
- means for determining a set of coefficients of a difference equation, as a function of said sampling frequency and of said target negative group delay value;
- means for calculating, on acquisition of a current value of the digital signal, a corresponding current value of said output signal, by means of said difference equation.

In a particular embodiment, the programmable digital processing unit also comprises means (CTRL Fe) for controlling the sampling frequency, enabling it to automatically adapt the sampling frequency used in the ADC analogue-to-digital conversion unit as a function of the time evolution of the digital signal delivered by this unit (and in particular an analysis of the rise and/or fall times of this signal).

These elements (units and means) in common of an electronic device for generating a negative group delay, presented above, are however capable of being implemented in different ways, as shown in relation to FIGS. 6 to 9, the choice between these different modes of implementation being able to be made in particular as a function of different operational constraints (for example integration constraints, processing speed, cost, etc.).

In a first implementation mode, illustrated in relation to FIG. 6, the programmable digital processing unit UT takes the form of a conventional non-specialised microcontroller (for example a microcontroller embedded on an Arduino-type card), the signal conditioning CD and analogue-to-digital ADC conversion units being arranged upstream of this microcontroller. This type of implementation offers a less integrated solution with a lower processing rate than others described later, but it is also less expensive and is suitable for processing particularly slow signals, in that it can generate a negative group delay in the order of a second, a minute, an hour or even several days.

In a second implementation mode, illustrated in relation to FIG. 7, the programmable digital processing unit UT has the form of a computer, the digital processing of the signal being implemented by a program executed on this computer, possibly within a virtual machine. In this case, a data acquisition (DAQ) hardware module, for example a data acquisition card, acts as an interface between the CPT sensor and the computer. More specifically, this DAQ hardware module is controlled by the computer and incorporates the ADC analogue-to-digital conversion unit. This mode of implementation is interesting in that it offers, for example, the possibility for a user to be able to modify the parameters of the digital signal processing program in real time. It also allows greater flexibility in the choice of programming language, and in particular enables the use of a graphical programming language such as LabView, which is very popular in the industrial world and in particular in the field of control/command systems.

In a third implementation mode, illustrated in relation to FIG. 8, the digital signal processing is implemented within a Field-Programmable Gate Array (FPGA)-type programmable integrated circuit in which the core of a processor (e.g. ARM, RISC-V, etc.) described in a hardware description language of the Verilog or VHDL type ("soft-core" type processor) is embedded, this processor core forming the UT digital processing unit. The ITF interfaces (e.g. SPI (Serial Peripheral Interface), USB (Universal Serial Bus) or I2C (Inter-Integrated Circuit) for communication with external electronic devices or peripherals may also already be integrated into the FPGA reconfigurable component. This type of implementation is advantageous in terms of integration, and enables high processing rates to be achieved. In such an implementation, the ADC analogue-to-digital conversion block positioned upstream of the FPGA reconfigurable component is typically a high-speed analogue-to-digital converter.

In a fourth implementation mode, illustrated in relation to FIG. 9, the digital signal processing is implemented within an Application-Specific Integrated Circuit (ASIC) in which the core of a processor (e.g. ARM, RISC-V, etc.) implemented in CMOS or other technology (hard-core type processor) is embedded, this processor core forming the UT digital processing unit. In particular, an ASIC makes it possible to integrate the entire processing chain, i.e. the CD conditioning block, the ADC analogue-to-digital conversion block in the form of a high-speed analogue-to-digital converter, and the ITF interfaces (e.g. SPI, I2C, USB, etc.) enabling communication with external electronic devices or peripherals. Such a mode of implementation is advantageous in terms of integration, and is also the one which, of all the modes of implementation presented in relation to FIGS. 6 to 9, enables the highest processing rates to be obtained. It is therefore suitable not only for processing slowly evolution signals (by enabling the generation of negative group delays of more than a second, a minute, an hour or even several days), but also for processing relatively fast evolution signals, by enabling for example the generation of a negative group delay in the order of a microsecond or a millisecond.

Of course, these modes of implementation are given purely by way of illustration and are not limitative, and other modes of implementation may be envisaged in the context of the present technique, for example an integration of the method of generating a negative group propagation time on generic processors for the general public or, on the contrary, processors specialised in certain fields of activity (industry 4.0, autonomous driving, intelligent mobility solutions, aeronautical systems, etc.), or even on very widespread Flash/EEPROM type memory components (particularly in smartphones).

The present technique for generating a negative group delay based on digital circuits, in any of the embodiments described above, therefore makes it possible to overcome most of the obstacles and technological barriers associated with the solutions of the prior art, based on analogue circuits. It thus constitutes a robust and flexible alternative opening the way to a large number of applications in fields as varied as industrial applications (e.g. for reducing or eliminating latencies in detection signals from sensors, observed in industrial control/command systems, particularly in the fields of robotics, automatic control, intelligent buildings or "smart-buildings", etc.), smart energy networks or smart-grids (e.g. to implement efficient management of electrical energy production by anticipating variations in weather conditions), signal processing in critical on-board systems (e.g. to reduce the reaction times of these critical systems, anticipate events from sensors, predict failures and breakdowns, particularly in the field of autonomous vehicles, aeronautics, nuclear power, etc.), signal reconstruction in medical engineering (e.g. to reconstitute a signal drowned in noise, such as an electroencephalogram, or heavily degraded by interference, such as an electrocardiogram), artificial intelligence (e.g. for the real-time prediction of information), etc.

The invention claimed is:

1. A method comprising:

generating, by an electronic device, from a signal supplied as input to said electronic device, an output signal having a negative group delay with respect to said input signal, the generating comprising at least one iteration of the following acts, implemented by a programmable digital processing unit of said electronic device:

obtaining a sampling frequency associated with a digital signal representative of said input signal;

obtaining a group delay value, referred to as a target negative group delay value, said target negative group delay value being controlled by said programmable digital processing unit to be less than or equal to a quarter of a current rise or fall variation time of said input signal when said input signal is non-deterministic, or to a quarter of a period of said input signal when said input signal is periodic;

determining a set of coefficients from a difference equation, as a function of said sampling frequency and said target negative group delay value, said difference equation defining a relationship between a value of said output signal, a value of said input signal and at least one previous value of said input signal and/or said output signal; and calculating, on acquisition of a current value of said digital signal, a corresponding current value of said output signal, by using said difference equation.

2. The method according to claim 1, wherein said difference equation is determined as a function of an operating mode selected from a recursive mode and a non-recursive mode, and as a function of an order associated with said operating mode.

3. The method according to claim 1, wherein said input signal is an analogue signal, and the method comprises an analogue-to-digital conversion of said input signal, said conversion comprising sampling said input signal at said sampling frequency, providing said digital signal representative of said input signal.

4. The method according to claim 3, comprising, prior to said analogue-to-digital conversion, conditioning said analogue input signal.

5. The method according to claim 1, wherein said sampling frequency of the input analogue signal is controlled by said programmable digital processing unit.

6. The method according to claim 5, wherein said sampling frequency of the input analogue signal is adapted as a function of a current rise and/or fall time of said input signal.

7. An electronic device for generating an output signal having a negative group delay with respect to an input signal supplied as input to said electronic device, said electronic device being comprising:

an input for receiving the input signal;

an output for supplying the output signal; and a programmable digital processing unit configured to:

obtain a sampling frequency associated with a digital signal representative of said input signal;

obtain a group propagation time value, referred to as target negative group propagation time value, said target negative group propagation time value being controlled by said programmable digital processing unit so as to be less than or equal to a quarter of a time of current variation in rise or fall of said input signal when said input signal is non-deterministic, or to a quarter of a period of said input signal when said input signal is periodic;

determine a set of coefficients of a difference equation as a function of said sampling frequency and said target negative group propagation time value, said difference equation defining a relationship between a value of said output signal, a value of said input signal and at least one previous value of said input signal and/or said output signal;

calculate, on acquisition of a current value of said digital signal, a corresponding current value of said output signal, by using said difference equation.

8. The electronic device according to claim 7, comprising an analogue-to-digital converter which samples said input signal at said sampling frequency, delivering said digital signal representative of said input signal, when said input signal is analogue.

9. The electronic device according to claim 7, wherein said programmable digital processing unit belongs to the group consisting of:

a microcontroller;

a virtual machine running on a computer;

A Field Programmable Gate Array (FPGA)-type programmable prediffused integrated circuit;

and an Application Specific Integrated Circuit (ASIC)-type integrated circuit with a specific application.

10. A non-transitory computer readable medium comprising program code instructions stored thereon for executing a method, when executed on a computer of an electronic device, wherein the method comprises:

generating, by the electronic device, from a signal supplied as input to said electronic device, an output signal having a negative group delay with respect to said input signal, the generating comprising at least one iteration of:

obtaining a sampling frequency associated with a digital signal representative of said input signal;

obtaining a group delay value, referred to as a target negative group delay value, said target negative group delay value being controlled by a programmable digital processing unit of said electronic device to be less than or equal to a quarter of a current rise or fall variation time of said input signal when said input signal is non-deterministic, or to a quarter of a period of said input signal when said input signal is periodic;

determining a set of coefficients from a difference equation, as a function of said sampling frequency and said target negative group delay value, said difference equation defining a relationship between a value of said output signal, a value of said input signal and at least one previous value of said input signal and/or said output signal; and calculating, on acquisition of a current value of said digital signal, a corresponding current value of said output signal, by using said difference equation.

* * * * *